US010903343B2

(12) United States Patent
Kurokawa

(10) Patent No.: US 10,903,343 B2
(45) Date of Patent: Jan. 26, 2021

(54) SEMICONDUCTOR DEVICE

(71) Applicant: Murata Manufacturing Co., Ltd., Kyoto-fu (JP)

(72) Inventor: Atsushi Kurokawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/774,917

(22) Filed: Jan. 28, 2020

(65) Prior Publication Data

US 2020/0168726 A1 May 28, 2020

Related U.S. Application Data

(63) Continuation of application No. PCT/JP2018/028481, filed on Jul. 30, 2018.

(30) Foreign Application Priority Data

Aug. 1, 2017 (JP) ................................ 2017-149448

(51) Int. Cl.
*H01L 29/737* (2006.01)
*H01L 29/08* (2006.01)
(Continued)

(52) U.S. Cl.
CPC ........ *H01L 29/737* (2013.01); *H01L 21/3205* (2013.01); *H01L 21/768* (2013.01);
(Continued)

(58) Field of Classification Search
CPC ............... H01L 29/737; H01L 29/0817; H01L 29/0821; H01L 29/41708; H01L 21/768;
(Continued)

(56) References Cited

U.S. PATENT DOCUMENTS 9,184,267 B1 11/2015 Lin
2013/0099372 A1* 4/2013 Kuechenmeister ..... H01L 24/03 257/737

(Continued)

FOREIGN PATENT DOCUMENTS

JP S57-172753 A 10/1982
JP H09-289215 A 11/1997

(Continued)

OTHER PUBLICATIONS

International Search Report issued in PCT/JP2018/028481; dated Oct. 9, 2018.

(Continued)

*Primary Examiner* — Joseph C. Nicely
(74) *Attorney, Agent, or Firm* — Studebaker & Brackett PC

(57) ABSTRACT

A semiconductor device includes an HBT; emitter wiring which is connected to an emitter electrode of the HBT and covers the HBT; a passivation film having an opening on the HBT in plan view; a UBM layer which is connected to the emitter wiring through the opening and made of a refractory metal with a thickness of 300 nm or more; and a pillar bump which is arranged on the UBM layer and includes a metal post and a solder layer. The UBM layer serves as a stress relaxation layer, thereby relaxing stress on the HBT due to a difference in thermal expansion coefficient between a GaAs-based material of each layer constituting the HBT and the pillar bump.

17 Claims, 9 Drawing Sheets

(51) Int. Cl.

| | |
|---|---|
| ***H01L 29/417*** | (2006.01) |
| ***H01L 21/768*** | (2006.01) |
| ***H01L 23/522*** | (2006.01) |
| ***H01L 21/3205*** | (2006.01) |

(52) U.S. Cl.
CPC ........ *H01L 23/522* (2013.01); *H01L 29/0817* (2013.01); *H01L 29/0821* (2013.01); *H01L 29/41708* (2013.01); *H01L 2224/0401* (2013.01)

(58) Field of Classification Search
CPC ............... H01L 21/3205; H01L 23/522; H01L 2224/0401
See application file for complete search history.

(56) References Cited

U.S. PATENT DOCUMENTS

| | | | | |
|---|---|---|---|---|
| 2014/0021603 | A1* | 1/2014 | Morris .................... | H01L 24/14 257/737 |
| 2016/0315060 | A1* | 10/2016 | Umemoto ............... | H01L 24/05 |
| 2018/0278227 | A1* | 9/2018 | Hurwitz ................. | H03H 9/581 |

FOREIGN PATENT DOCUMENTS

| | | | |
|---|---|---|---|
| JP | 2001-077150 | A | 3/2001 |
| JP | 2001-319936 | A | 11/2001 |
| JP | 2008-159949 | A | 7/2008 |
| JP | 2015/104967 | A1 | 7/2015 |

OTHER PUBLICATIONS

International Preliminary Report on Patentability and Written Opinion issued in PCT/JP2018/028481; dated Feb. 4, 2020.

* cited by examiner

FIG. 4
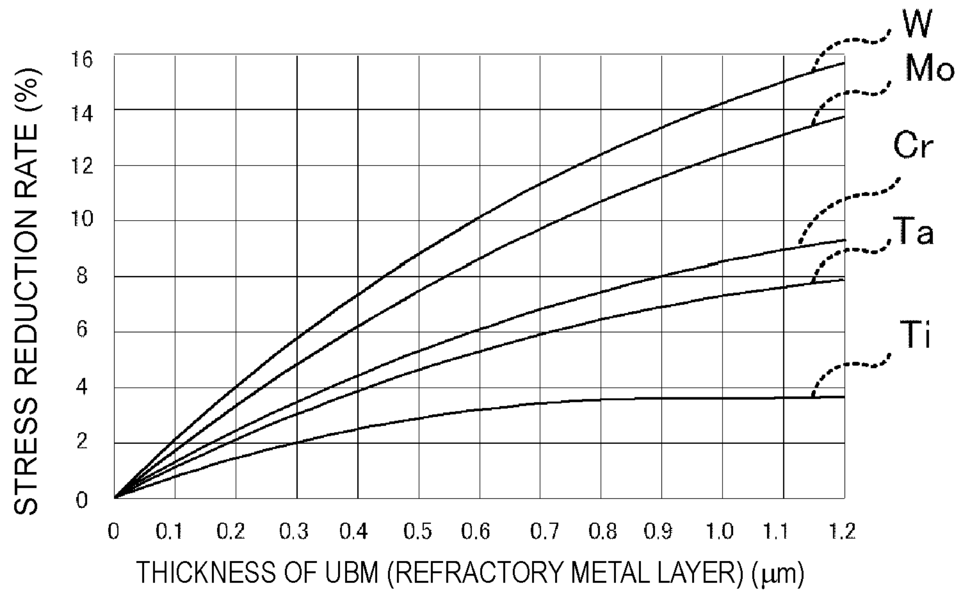
FIG. 5
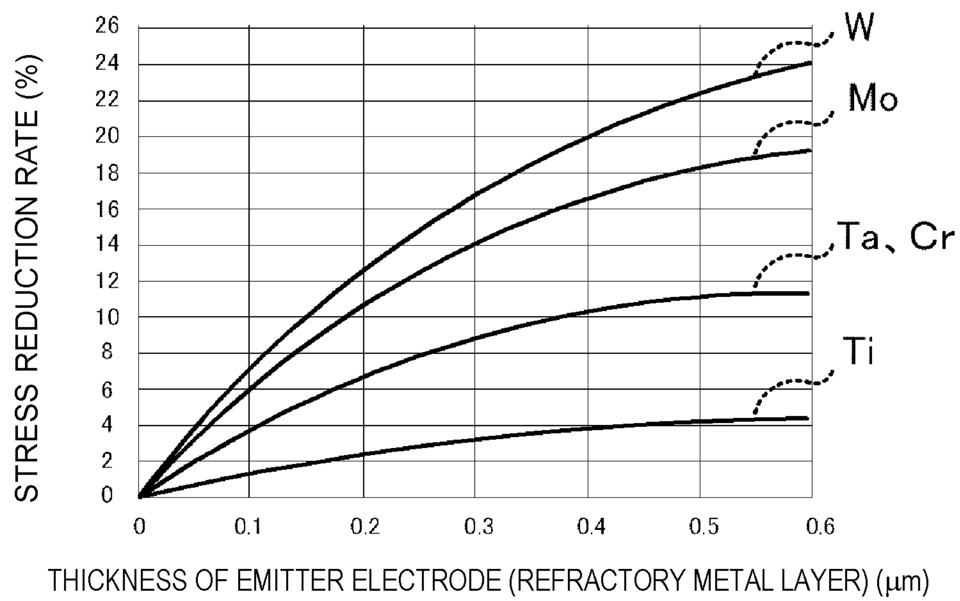
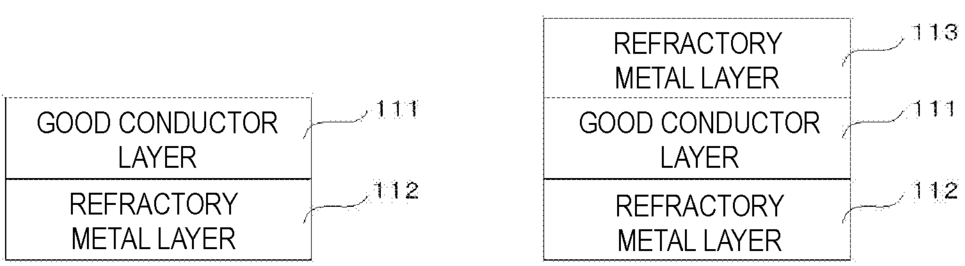
FIG. 6A
FIG. 6B

SEMICONDUCTOR DEVICE

CROSS-REFERENCE TO RELATED APPLICATIONS

This application claims benefit of priority to International Patent Application No. PCT/JP2018/028481, filed Jul. 30, 2018, and to Japanese Patent Application No. 2017-149448, filed Aug. 1, 2017, the entire contents of each are incorporated herein by reference.

BACKGROUND

Technical Field

The present disclosure relates to a semiconductor device and, in particular, relates to a semiconductor device having a structure in which a bump is formed right above a heterojunction bipolar transistor.

Background Art

Heterojunction bipolar transistors (HBTs) are used as transistors constituting power amplifier modules for portable terminals and the like.

In a proposed HBT, a structure is employed in which by arranging a bump right above an emitter layer, thermal resistance is reduced. However, in this structure, when a current is applied to the HBT, thermal stress occurs due to a difference between the thermal expansion coefficient of a semiconductor layer, such as the emitter layer, constituting the HBT and the thermal expansion coefficient of the bump. The thermal stress causes a problem in that the current amplification factor of the HBT decreases in a short period of time.

In order to solve this problem, International Publication No. 2015/104967 proposes an HBT having a structure in which a bump is arranged at a position shifted from a position of an emitter layer in plan view. The HBT includes emitter wiring electrically connected to an emitter, a passivation film having an opening that exposes the emitter wiring, and a bump formed on the passivation film so as to bury the opening and connected to the emitter layer via the emitter wiring. According to the HBT disclosed in International Publication No. 2015/104967, by employing this structure, thermal stress can be relaxed while suppressing thermal resistance.

SUMMARY

In the HBT disclosed in International Publication No. 2015/104967, the bump is formed at a position shifted from a position of the emitter layer in plan view. This results in an increase in device size (occupation area) and an increase in manufacturing cost. Furthermore, since the bump which also serves as a heat-dissipating device and the transistor are disposed away from each other, thermal resistance is high, heat dissipation performance is low, and there is a concern that, because of heat generation, the performance of the HBT may not be exhibited sufficiently.

The present disclosure has been made under the circumstances as described above, and provides a semiconductor device provided with a heterojunction bipolar transistor having an excellent heat dissipation property and having a small device size.

That is, a semiconductor device according to a first aspect of the present disclosure includes an HBT including an emitter layer and a collector layer, a bump formed above the HBT, and a stress relaxation layer which is arranged between the emitter layer or the collector layer of the HBT and the bump, is made of a refractory metal including W, an alloy of a refractory metal including W, or a compound of a refractory metal including W, and has a thickness of 100 nm or more.

A semiconductor device according to a second aspect of the present disclosure includes an HBT including an emitter layer and a collector layer, a bump formed above the HBT, and a stress relaxation layer which is arranged between the emitter layer or the collector layer of the HBT and the bump, is made of a refractory metal including any one of Ti, Mo, Ta, Nb, and Cr, an alloy of any of these refractory metals, or a compound of any of these refractory metals, and has a thickness of 300 nm or more.

For example, the HBT may further include a base layer and an emitter electrode connected to the emitter layer, and the semiconductor device may further include emitter wiring which is electrically connected to the emitter electrode and formed at a position covering the HBT and an insulating layer which is formed on the emitter wiring and has an opening that exposes a region right above the emitter layer. In this case, the stress relaxation layer may include, for example, a layer formed on the insulating layer and connected to the emitter wiring through the opening, and the bump may include a metal layer which is formed on the stress relaxation layer and has a higher thermal expansion coefficient than the stress relaxation layer, and a solder layer formed on the metal layer.

For example, the HBT may include a base layer and an emitter electrode connected to the emitter layer. In this case, the stress relaxation layer may include at least part of the emitter electrode.

For example, the HBT may include a base layer, an emitter electrode connected to the emitter layer, and emitter wiring which is formed on the emitter electrode and connects the emitter electrode to an external circuit. In this case, the stress relaxation layer may include at least part of the emitter wiring.

The emitter wiring may further include, for example, first emitter wiring which connects the emitter electrode to an external circuit and second emitter wiring connected to the first emitter wiring. In this case, the stress relaxation layer may be located between the first emitter wiring and the second emitter wiring at a position on the emitter layer in plan view.

For example, the emitter wiring and the emitter electrode may be integrally formed, and the emitter wiring may also serve as the emitter electrode.

For example, the bump, the stress relaxation layer, and the emitter layer may be formed at overlapping positions in plan view. In this case, desirably, the area of a portion of the emitter layer overlapping the bump and the stress relaxation layer is 51% or more of the area of the emitter layer.

For example, the HBT may include a base layer and a collector electrode connected to the collector layer, and the semiconductor device may further include collector wiring which is electrically connected to the collector electrode and formed at a position covering the HBT and an insulating layer which is formed on the collector wiring and has an opening that exposes a region right above the collector layer. In this case, the stress relaxation layer may include, for example, a layer formed on the insulating layer and connected to the collector wiring through the opening, and the bump may include a metal layer which is formed on the stress relaxation layer and has a higher thermal expansion coefficient than the stress relaxation layer, and a solder layer formed on the metal layer.

For example, the HBT may further include a base layer and a collector electrode connected to the collector layer. In this case, the stress relaxation layer may include at least part of the collector electrode.

For example, the HBT may include a base layer, a collector electrode connected to the collector layer, and collector wiring which is formed on the collector electrode and connects the collector electrode to an external circuit. In this case, the stress relaxation layer may include at least part of the collector wiring.

For example, the collector wiring may include first collector wiring which connects the collector electrode to an external circuit and second collector wiring connected to the first collector wiring. In this case, the stress relaxation layer may be located between the first collector wiring and the second collector wiring at a position on the collector layer in plan view.

For example, the collector wiring and the collector electrode may be integrally formed, and the collector wiring may also serve as the collector electrode.

For example, the bump, the stress relaxation layer, and the collector layer may be formed at overlapping positions in plan view. In this case, for example, desirably, the area of a portion of the collector layer overlapping the bump and the stress relaxation layer is 51% or more of the total area of the collector layer.

For example, an under bump metal layer may be arranged so as to be in contact with a lower part of the bump. In this case, the stress relaxation layer may be constituted by the under bump metal layer.

For example, the stress relaxation layer may include a plurality of layers which are stacked together. In this case, desirably, the total thickness of the layers made of a refractory metal, an alloy of a refractory metal, or a compound of a refractory metal is 100 nm or 300 nm or more.

For example, the stress relaxation layer may be formed of a multilayer body including a first layer made of a refractory metal, an alloy of a refractory metal, or a compound of a refractory metal, and a second layer having a higher conductivity than the first layer. In this case, the first layer may be formed on the HBT, and the second layer may be formed so as to extend in a broader region than the first layer.

According to the structure described above, the bump is formed above the HBT. Therefore, a high heat dissipation property can be obtained, and also, the device area can be reduced.

Furthermore, thermal stress applied from the bump on the HBT is relaxed by the action of the stress relaxation layer. As a result, it is possible to prevent a problem in that, when a current is applied in a high-temperature environment, the current amplification factor of the HBT decreases in a short period of time, and reliability of a semiconductor device provided with the HBT can be improved.

BRIEF DESCRIPTION OF THE DRAWINGS

FIG. 4 is a graph showing the relationship among the material and thickness of a UBM layer and the reduction rate of thermal stress applied on an emitter layer in a semiconductor device having the structure shown in FIGS. 1 to 3;

FIG. 5 is a graph showing the relationship among the material and thickness of an emitter electrode and the reduction rate of thermal stress applied on an emitter layer in a semiconductor device according to Embodiment 2 of the present disclosure;

FIGS. 6A and 6B are diagrams each showing a structure of the wiring of a semiconductor device according to Embodiment 3 of the present disclosure;

DETAILED DESCRIPTION

Semiconductor devices including a heterojunction bipolar transistor (HBT) according to embodiments of the present disclosure will be described below with reference to the drawings.

Embodiment 1

Figure 1:
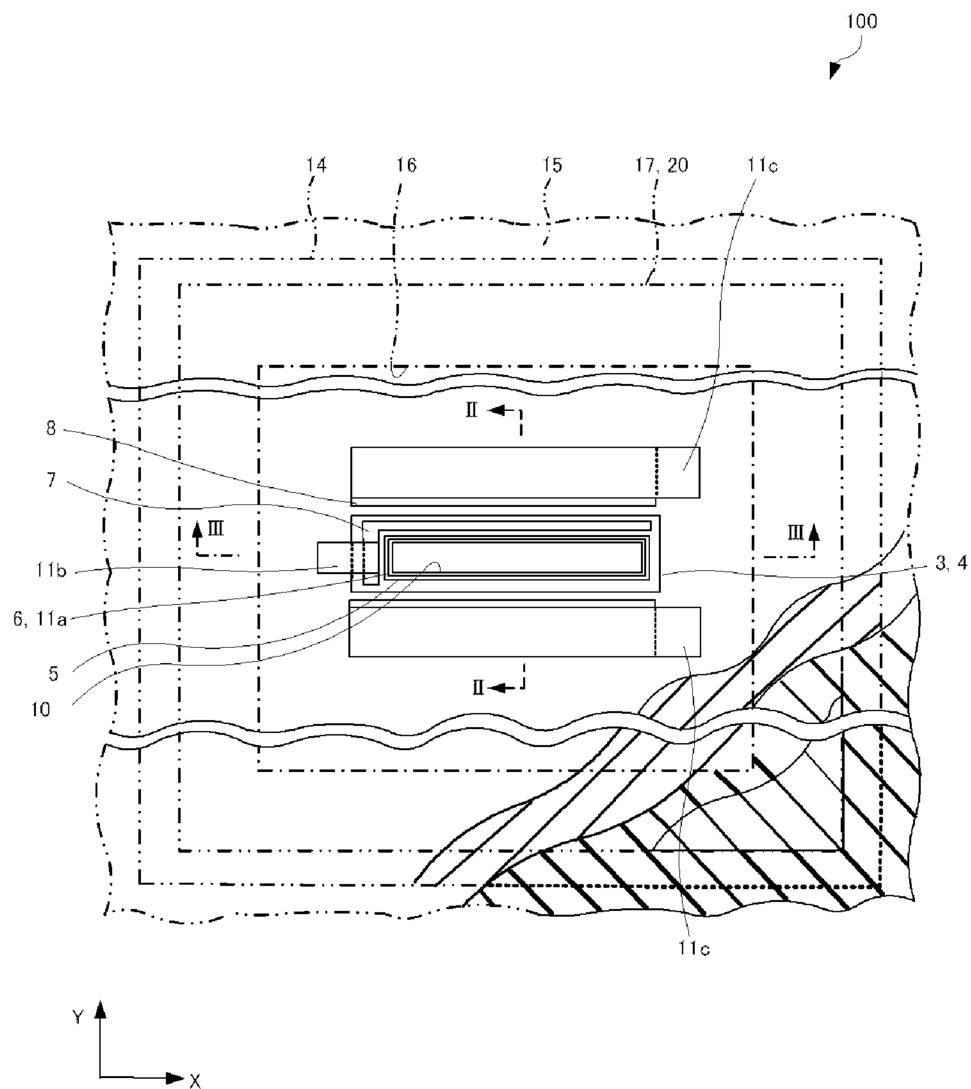
FIG. 1 is a plan view of a semiconductor device according to Embodiment 1 of the present disclosure.
Figure 2:
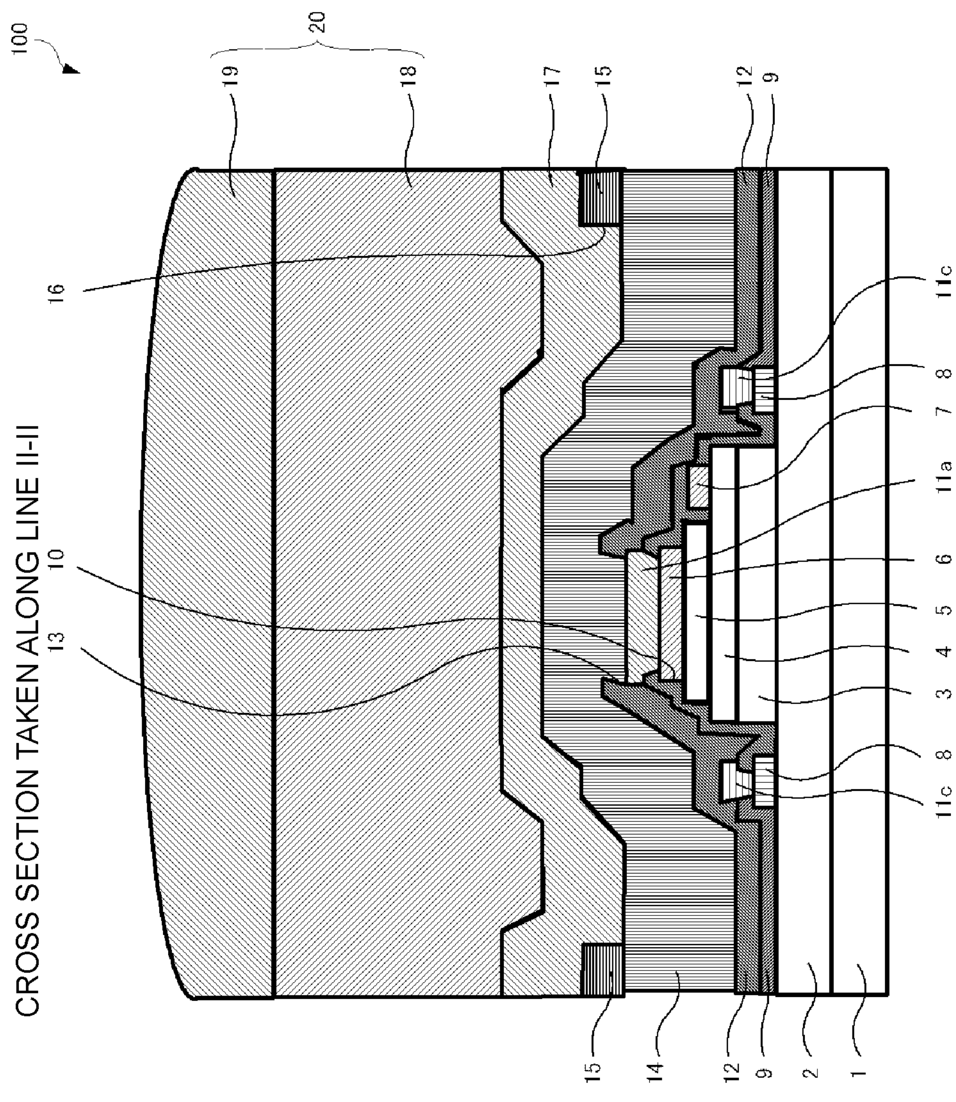
FIG. 2 is a cross-sectional view taken along the line II-II of the semiconductor device shown in FIG. 1.
Figure 3:
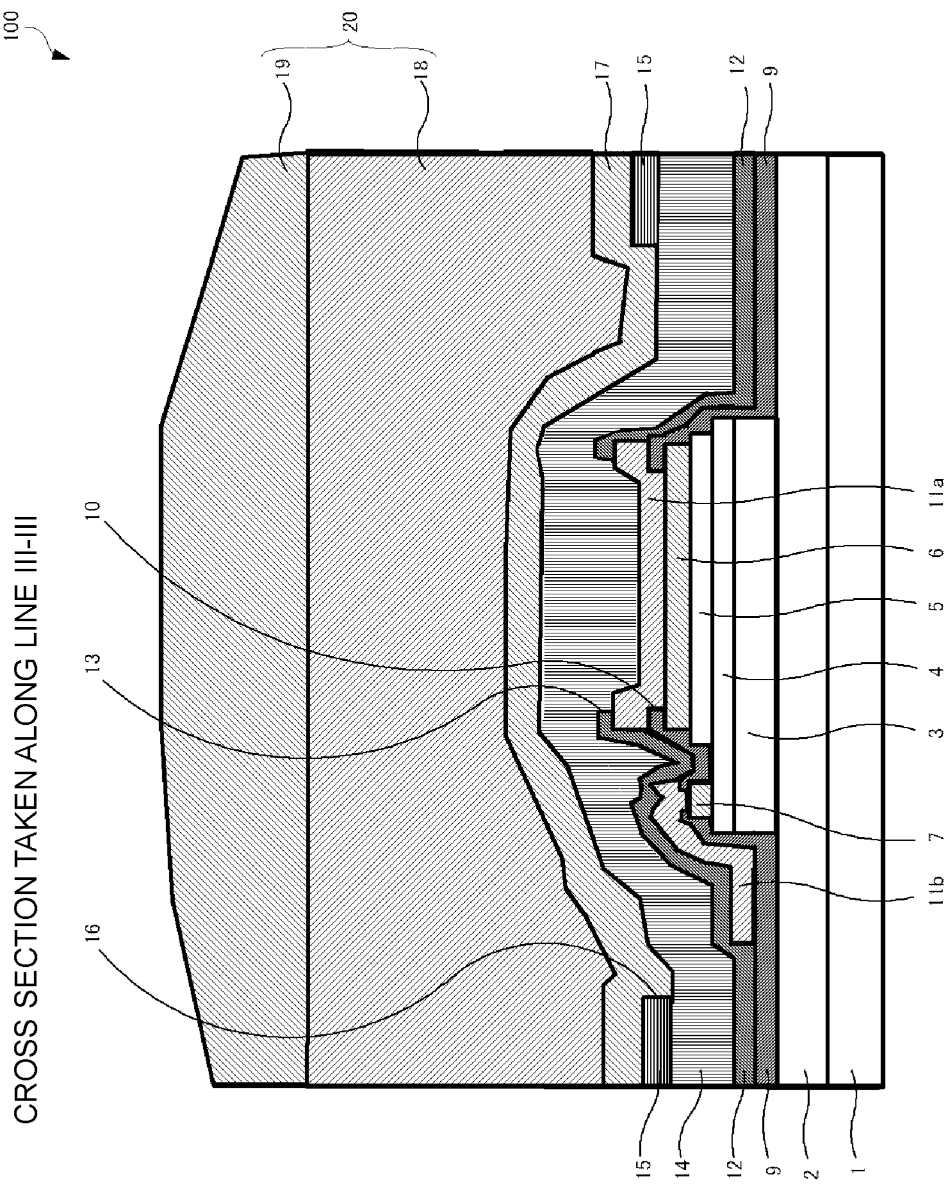
FIG. 3 is a cross-sectional view taken along the line of the semiconductor device shown in FIG. 1.

As shown in FIG. 1 (plan view), FIG. 2 (cross-sectional view taken along the line II-II of FIG. 1), and FIG. 3 (cross-sectional view taken along the line of FIG. 1), a semiconductor device 100 according to this embodiment includes a GaAs substrate 1, a subcollector layer 2 formed on the GaAs substrate 1, a collector layer 3 formed on the subcollector layer 2, a base layer 4 formed on the collector layer 3, an emitter layer 5 formed on the base layer 4, an emitter electrode 6 formed on the emitter layer 5, a base electrode 7 formed on the base layer 4, a collector electrode 8 formed on the subcollector layer 2, a first insulating layer 9, first emitter wiring 11*a*, base wiring 11*b*, collector wiring 11*c*, a second insulating layer 12, second emitter wiring 14, a passivation film 15, an under bump metal layer (hereinafter, referred to as a UBM layer) 17, and a pillar bump 20.

An HBT according to this embodiment includes the subcollector layer 2, the collector layer 3, the base layer 4, the emitter layer 5, the emitter electrode 6, and the base electrode 7.

The GaAs substrate 1 is made of a semi-insulating GaAs crystal.

The subcollector layer 2 is made of a heavily doped n-type GaAs crystal in which an n-type dopant is doped at high concentration, has a thickness of about 0.5 μm, and is formed on the GaAs substrate 1. A region of the subcollector layer 2 that is required for isolation between the HBT and other circuit elements (not shown) is insulated by ion implantation or the like.

The collector layer 3 serves as a collector of the HBT and is formed on the subcollector layer 2. The collector layer 3 is made of a heavily doped n-type GaAs crystal in which an n-type dopant is doped at high concentration and, for example, has a thickness of about 1.0 μm.

The base layer 4 serves as a base of the HBT and is formed on the collector layer 3. The base layer 4 is made of a p-type GaAs crystal in which a p-type dopant is doped and, for example, has a thickness of about 100 nm.

The emitter layer 5 serves as an emitter of the HBT and is formed on the base layer 4. The emitter layer 5 has a three-layer structure, in which, for example, a first layer made of an n-type InGaP crystal with a thickness of 30 to 40 nm, a second layer made of a heavily doped n-type GaAs crystal with a thickness of 100 nm, and a third layer made of a heavily doped n-type InGaAs crystal with a thickness of 100 nm are stacked in this order from the base layer 4 side. Note that the third layer is a layer that forms an ohmic contact with the emitter electrode 6.

The emitter electrode 6 is an electrode that connects the emitter layer 5 to an external circuit, is formed on the emitter layer 5, and, for example, is formed of a Ti film with a thickness of about 50 nm.

The base electrode 7 is an electrode that connects the base layer 4 to an external circuit. The base electrode 7 is formed on the base layer 4 and is formed of a multilayer body in which, for example, a Ti film with a thickness of about 50 nm, a Pt film with a thickness of about 50 nm, and a Au film with a thickness of about 200 nm are stacked in this order from the base layer 4 side. As shown in FIG. 1, the base electrode 7 is L-shaped in plan view.

The collector electrode 8 is an electrode that connects the collector layer 3 to an external circuit. The collector electrode 8 is formed on the subcollector layer 2 and electrically connected to the collector layer 3 with the subcollector layer 2 interposed therebetween. The collector electrode 8 is formed of a multilayer body in which, for example, a AuGe film with a thickness of about 60 nm, a Ni film with a thickness of about 10 nm, and a Au film with a thickness of about 200 nm are stacked in this order from the subcollector layer 2 side.

The first insulating layer 9 is made of an insulating material, such as SiN, and covers the subcollector layer 2, the collector layer 3, the base layer 4, the emitter layer 5, the emitter electrode 6, the base electrode 7, and the collector electrode 8 so as to provide interlayer insulation. The first insulating layer 9 has a first opening 10 formed therein configured to expose an upper surface of the emitter electrode 6.

The first emitter wiring **11*a* is formed on the first insulating layer 9, is connected to the emitter electrode 6 through the first opening 10, and electrically connects the emitter electrode 6 to an external circuit. The first emitter wiring 11*a* is formed of a multilayer body, for example, including a Ti film with a thickness of about 50 nm and a Au film with a thickness of about 1 μm. Note that the Ti film is located on the emitter electrode 6** side.

The base wiring **11*b* is formed on the first insulating layer 9 and is connected to the base electrode 7 through a contact hole formed in the first insulating layer 9. The base wiring 11*b* electrically connects the base electrode 7 to an external circuit. The base wiring 11*b* is formed of a multilayer body, for example, including a Ti film with a thickness of about 50 nm and a Au film with a thickness of about 1 μm. Note that the Ti film is located on the base electrode 7** side.

The collector wiring **11*c* is formed on the first insulating layer 9 and is connected to the collector electrode 8 through a contact hole formed in the first insulating layer 9. The collector wiring 11*c* electrically connects the collector electrode 8 to an external circuit. The collector wiring 11*c* is formed of a multilayer body, for example, including a Ti film with a thickness of about 50 nm and a Au film with a thickness of about 1 μm. The Ti film is located on the collector electrode 8** side.

Hereinafter, the first emitter wiring **11*a*, the base wiring 11*b*, and the collector wiring 11*c* formed on the first insulating layer 9 may be generically referred to as first wiring 11*a* to 11*c***.

The second insulating layer 12 covers the first wiring **11*a* to 11*c* and, for example, is formed of a SiN film with a thickness of about 100 nm. A second opening 13 that exposes the first emitter wiring 11*a* is formed in a region of the second insulating layer 12 right above the emitter layer 5**.

The second emitter wiring 14 is formed on the second insulating layer 12, is electrically connected to the first emitter wiring **11*a* through the second opening 13, and electrically connects the emitter electrode 6 to an external circuit. The second emitter wiring 14 is formed of a multilayer body, for example, including a Ti film with a thickness of about 50 nm (on the substrate side) and a Au film with a thickness of about 4 μm. The second emitter wiring 14 is formed so as to cover the whole HBT including the collector layer 3, the base layer 4, and the emitter layer 5**.

The passivation film 15 is, for example, formed of a SiN film with a thickness of about 500 nm, covers the second emitter wiring 14, protects the HBT from the external environment, and electrically insulates the HBT from the outside. A third opening 16 that exposes the second emitter wiring 14 is formed at a position right above the emitter layer 5 of the passivation film 15.

The under bump metal (hereinafter, referred to as UBM) layer 17 and the pillar bump 20 disposed thereon are formed on the passivation film 15 so as to bury the third opening 16.

The UBM layer 17 is located under the pillar bump 20 (on the second emitter wiring 14 side) and is made of a refractory metal including any one of W, Ti, Mo, Ta, Nb, and Cr, an alloy of any of these refractory metals, or a compound of any of these refractory metals. The UBM layer 17 has a thickness of about 100 nm to 3 μm. The UBM layer 17 serves as a stress relaxation layer that relaxes thermal stress applied on the HBT. The details thereof will be described later.

The pillar bump 20 has a multilayer structure including a metal post 18 and a solder layer 19.

The metal post 18 is formed on the UBM layer 17 and, for example, is made of Cu with a thickness of about 50 μm. The metal post 18 electrically connects a circuit on a printed circuit board and the second emitter wiring 14 to each other with the solder layer 19 interposed therebetween. Furthermore, the metal post 18 also has a function of transferring heat generated in the semiconductor device 100 to a printed circuit board to dissipate heat.

The solder layer 19 is, for example, formed of a Sn layer or a layer containing Sn as a main component with a thickness of about 30 μm, and is joined with solder to an electrode of a printed circuit board.

Note that a barrier metal layer for preventing interdiffusion, for example, made of Ni or the like may be disposed between the metal post 18 and the solder layer 19.

The planar positional relationship among the UBM layer 17, the pillar bump 20, the third opening 16 of the passivation film 15, and the HBT will be described below.

As shown in FIG. 1, the emitter layer 5 is substantially rectangular-shaped in plan view. When a longitudinal direction of the emitter layer 5 is the X direction, and a direction orthogonal to the longitudinal direction is the Y direction, the length (width) in the Y direction of the emitter layer 5 is set, for example, at 2 to 4 μm, and the length in the X direction (longitudinal direction) is set, for example, at 20 to 40 μm. On the other hand, the length in the X direction of the pillar bump 20 is set, for example, at 75 μm, and the length in the Y direction is set, for example, at about 75 μm to 500 μm. The UBM layer 17 is formed such that the outer edge thereof corresponds to the outer edge of the pillar bump 20.

The length in the X direction of the third opening 16 of the passivation film 15 is set at 55 μm. Furthermore, the third opening 16 of the passivation film 15 is arranged so as to surround the emitter layer 5.

Furthermore, in plan view, the UBM layer 17 and the pillar bump 20 are arranged right above the emitter layer 5, i.e., at a position at which the distance from the emitter layer 5 is shortest. The UBM layer 17 and the pillar bump 20 are directly connected, through the third opening 16, to the second emitter wiring 14 right above the emitter layer 5.

The HBT is arranged in a region overlapping the UBM layer 17 and the pillar bump 20. In other words, the UBM layer 17 and the pillar bump 20 cover the whole HBT.

The semiconductor device 100 having the structure described above, as in the usual HBT, in response to a base current supplied to the base layer 4 via the base wiring 11*b* and the base electrode 7, amplifies a current flowing between the emitter layer 5 and the collector layer 3 via the first emitter wiring 11*a* and the collector wiring 11*c*, thus functioning as a power amplifier.

As described in the Background Art, there is a large difference between the thermal expansion coefficient of a member composed mainly of GaAs constituting the HBT and the thermal expansion coefficient of the pillar bump 20. As a result, when a reliability test in which actual operation is simulated, i.e., a high temperature operating life (HTOL) test in which a current is applied to a semiconductor device in a high-temperature environment is performed, thermal stress due to a difference between the thermal expansion coefficient of the emitter layer 5 or the like of the HBT and the thermal expansion coefficient of the pillar bump 20 is applied on the emitter layer 5 or the like.

Specifically, GaAs has a low thermal expansion coefficient of 6 ppm/° C., and InGaP has substantially the same thermal expansion coefficient. In contrast, Cu constituting the metal post 18 of the pillar bump 20 has a high thermal expansion coefficient of 16.5 ppm/° C., and Sn constituting the solder layer 19 has a high thermal expansion coefficient of 22 ppm/° C.

Therefore, if a structure in which the metal post 18 and the second emitter wiring 14 are directly connected to each other is employed, when the semiconductor device 100 is placed in a high-temperature environment, thermal strain will occur due to a difference in amount of thermal expansion, and a large thermal stress will be applied on the HBT, centering on the emitter layer 5. Accordingly, as disclosed in International Publication No. 2015/104967, a structure in which the position of the emitter layer is shifted from the position of the pillar bump to secure a distance is effective.

In contrast, in the semiconductor device 100 according to this embodiment, while the pillar bump 20 is formed right above the emitter layer 5, the UBM layer 17, which is made of a refractory metal, an alloy of the refractory metal, or a compound of the refractory metal and has a relatively large thickness of 100 nm or 300 nm or more, is arranged under the pillar bump 20. The UBM layer 17 relaxes thermal strain due to a difference in thermal expansion coefficient and prevents the thermal strain from being transferred to the region where the HBT is formed. In other words, the UBM layer 17 is located between the HBT and the pillar bump 20, and serves as a stress relaxation layer that relaxes thermal stress applied on the HBT, particularly to the emitter layer 5, due to a difference in thermal expansion coefficient.

The present inventor has found that, in the case of a structure including a thin UBM layer 17, the results of an HTOL test of an HBT in which a bump is formed in a region right above an emitter layer 5 show that the HBT deteriorates in a short period of time and cannot endure practical use. The reason for this is that, as described above, thermal stress due to the thermal expansion of solder, Cu, or the like constituting the bump damages semiconductor layers constituting the HBT, resulting in a decrease in reliability.

The present inventor has found that, in comparison with this structure, in the case where the thermal stress is reduced by about 2%, the results of an HTOL test show that life improves by about 35 times, and the life of the HBT is in a practically endurable range. In other words, it has been found that by setting the thermal stress reduction rate to be 2% or more, an HBT endurable for practical use can be obtained.

Note that, although it has been confirmed that by increasing the thermal stress reduction rate to more than 2%, the life of the HBT is further prolonged, the prolongation becomes gradually milder. For example, at a stress reduction of 28%, 41 times improvement in life was obtained.

The preferable thermal stress reduction rate of "2% or more" can be achieved by setting the thickness of the UBM layer 17 at 300 nm or more when the UBM layer 17 is made of a refractory metal including any one of W, Ti, Mo, Ta, Nb, and Cr, an alloy of any of these refractory metals, or a compound of any of these refractory metals, as described above. More preferably, the thickness may be further increased, or a material having a relatively low thermal expansion coefficient among these refractory metals, for example, W, Cr, Mo, Ta, or Nb, other than Ti, an alloy thereof, or a compound thereof may be used. In particular, when W having a low thermal expansion coefficient, an alloy thereof, or a compound thereof is used for the UBM layer 17, by setting the thickness at 100 nm or more, the thermal stress can be reduced by 2% or more. In other words, in order to obtain a stress reduction rate of 2% or more, the UBM layer 17 may be formed as i) a W layer or a layer made of an alloy of W or a compound of W with a thickness of 100 nm or more; or ii) whether including or not including W, a refractory metal layer or a layer made of an alloy of a refractory metal or a compound of a refractory metal with a thickness of 300 nm or more.

The W layer in i) may be a layer composed mainly of W. For example, a small amount (e.g., 40% or less) of other components, such as Cu and Al, may be mixed with W. The refractory metal layer in ii) may be a layer composed mainly of any one of Ti, Mo, Ta, Nb, and Cr.

The thickness of the UBM layer 17 is preferably defined as an average value of a portion which is as flat as possible above the emitter layer 5. When the layer thickness check is performed to ensure quality, the thickness may be checked at a plurality of points above the emitter layer 5 by using cross-sectional TEM or the like. For example, in order to check a thickness of 100 nm or more, the average may be taken by using cross-sectional TEM or the like. When the thickness is 1 μm or more, the thickness may be checked by using cross-sectional SEM or the like.

This respect will be described more specifically with reference to data. FIG. 4 shows an example of a graph evaluating the relationship among the material and thickness of the UBM layer 17 and the rate (%) of reduction of stress applied on the emitter layer 5 due to the UBM layer 17.

In the simulation shown in FIG. 4, the transistor structure is the same as that of this embodiment. The size of the bump is set to be typical values: 75 μm in width and 240 μm in length. The size of the emitter layer is also set to be typical values: 4 μm in width and 30 μm in length. The thermal stress generated when the temperature is decreased from 230° C., at which the bump is mounted, to the transistor operating temperature Tj=150° C. is calculated. The thickness of the UBM layer 17 is the average value of measured values at a plurality of points of a flat portion above the emitter layer.

The horizontal axis of FIG. 4 represents the thickness of the UBM layer 17 with units of measure of μm. The vertical axis of FIG. 4 represents the rate (%) of reduction of stress applied on the emitter layer 5 when the thickness of the UBM layer 17 is 0 for each thickness. Note that the simulation was performed on the assumption that the metal post 18 of the pillar bump 20 was made of Cu with a thickness of 50 μm, and the solder layer 19 was made of Sn with a thickness of 30 μm.

As shown in FIG. 4, in the case where the material of the UBM layer 17 is W having a thermal expansion coefficient of 4.5 ppm/° C., when the thickness is 100 nm (0.1 μm) or more, the thermal stress applied on the emitter layer 5 can be reduced by 2% or more. Furthermore, by setting the thickness at 130 nm in the case of Mo having a thermal expansion coefficient of 5.1 ppm/° C., at 140 nm in the case of Cr having a thermal expansion coefficient of 4.9 ppm/° C., at 200 nm in the case of Ta having a thermal expansion coefficient of 6.3 ppm/° C., and at 300 nm in the case of Ti having a thermal expansion coefficient of 8.6 ppm/° C., the thermal stress reduction rate is 2% or more.

In the case of any of the materials, it has been confirmed that when a thickness of 300 nm or more is secured, the stress reduction rate is 2% or more. Regarding Nb, since the thermal expansion coefficient is an intermediate value between that of W and that of Ti, the same stress reduction effect can be exhibited.

Furthermore, as the thickness of the UBM layer 17 increases, the thermal stress decreases. Although a thickness of 1.2 μm or more is not shown in FIG. 4, when the thickness of the UBM layer 17 is increased to about 5 μm, a further stress reduction effect is obtained. However, since the effect is saturated to a certain extent, about 5 μm is the upper limit of the thickness with which the thermal stress reduction effect can be obtained. Note that the thickness of the UBM layer 17 is not particularly limited.

Furthermore, the same effect can be obtained when the UBM layer 17 is made of an alloy of a refractory metal including any one of W, Ti, Mo, Ta, Nb, and Cr or a compound of any of these refractory metals, and the thickness thereof is set at 300 nm or more. Examples of the alloy of a refractory metal including any one of W, Ti, Mo, Ta, Nb, and Cr include TiW, which is an alloy of W and Ti. As the compound of a refractory metal including any one of W, Ti, Mo, Ta, Nb, and Cr, nitrides, silicides, and the like of the refractory metal may be used. Examples thereof include WN, TaN, WSi, TiN, MoSi, TaSi, TiSi, and TiWN. In this case, regarding an alloy of W having a low thermal expansion coefficient, such as TiW, and a compound of W, such as WSi (tungsten silicide), when the thickness is 100 nm or more, a stress reduction rate of 2% or more can be obtained. In the case of other alloys and compounds, for example, TaN, TiN, and MoSi, when the thickness is 300 nm or more, a stress reduction rate of 2% or more can be obtained.

Furthermore, the UBM layer 17 may be formed as a multilayer film including these materials. For example, the UBM layer 17 may have a two-layer structure including a Ti layer having good adhesion to the passivation film 15 (SiN) and the like as a lower layer and a W layer having a high stress reduction effect as an upper layer. Furthermore, a layer made of TiW which is an alloy of W and Ti with a thickness of 100 nm or more may be used as the UBM layer 17. The UBM layer 17 may have a multilayer structure including three or more layers.

In the case of the UBM layer 17 having a multilayer structure, at least one of the stacked layers may be formed as i) a W layer or a layer made of an alloy of W or a compound of W with a thickness of 100 nm or more, or otherwise, ii) whether including or not including W, a refractory metal layer or a layer made of an alloy of a refractory metal or a compound of a refractory metal with a total thickness of the multilayer structure of 300 nm or more. In this case, desirably, the layers are arranged such that the layer closer to the metal post 18 has a higher thermal expansion coefficient and the layer closer to the emitter layer 5 has a lower thermal expansion coefficient. The W layer in i) and the refractory metal layer in ii) each may be a layer composed mainly of W or the other refractory metal, and may contain impurities or small amounts of other substances.

As described above, in the semiconductor device 100 according to this embodiment, the thermal stress applied on the emitter layer 5 and the like can be relaxed by 2% or more. Therefore, it is possible to prevent a problem in that, when an HTOL test is conducted, the current amplification factor of the HBT decreases in a short period of time, and reliability of the semiconductor device 100 can be improved.

Furthermore, in this embodiment, the emitter layer 5 can be arranged right below the pillar bump 20 which serves as a heat-dissipating device. As a result, thermal resistance which is an indicator of the heat dissipation property can be reduced by about 1/1.5, compared with existing techniques. Consequently, it is possible to suppress an increase in temperature of an HBT that generates a large amount of heat when used as a power transistor, the performance of the HBT can be brought out, and high-frequency characteristics can be improved.

Furthermore, in this embodiment, the arrangement position of the pillar bump 20 with respect to the emitter layer 5 is not limited, and the degree of freedom of layout is high. Therefore, the semiconductor device 100 can be arranged with a small overall size, and reduction in size and cost of the semiconductor device can be achieved.

Embodiment 2

In Embodiment 1, by arranging the UBM layer 17 made of a refractory metal or the like between the metal post 18 and the second emitter wiring 14, thermal stress on the emitter layer 5 is relaxed. In this structure, the UBM layer 17 serves as a stress relaxation layer. The present disclosure is not limited to this structure.

As long as a layer made of a refractory metal or the like which serves as a stress relaxation layer that relaxes thermal stress on the emitter layer 5 can be arranged between the metal post 18 and the HBT (the emitter layer 5, in particular), the structure is arbitrary.

A semiconductor device in which an emitter electrode 6 serves as part of an HBT and at least part of the emitter electrode 6 and a UBM layer 17 serve as a stress relaxation layer will be described below as Embodiment 2.

The basic structure of the semiconductor device according to this embodiment is the same as that of the semiconductor device 100 of Embodiment 1 described with reference to FIGS. 1 to 3.

In this embodiment, the emitter electrode 6 is made of a refractory metal including any one of W, Ti, Mo, Ta, Nb, and Cr, an alloy of any of these refractory metals, or a compound of any of these refractory metals. Specifically, the emitter electrode 6 is made of, for example, Ti, W, TiW, WSi, Cr, Mo, Ta, Nb, TaN, TiN, WN, TaSi, TiSi, MoSi, TiWN, or the like, with a thickness of 300 nm or more. On the other hand, the UBM layer 17 is a thin film with a thickness of about 50 nm and is made of Ti.

In this embodiment, the UBM layer 17 is thin with a thickness of about 50 nm, and it is difficult, with the UBM layer 17 alone, to sufficiently reduce the thermal stress applied on the emitter layer 5.

On the other hand, in this embodiment, the emitter electrode 6 is formed of a thick film of a refractory metal, an alloy of a refractory metal, or a compound of a refractory metal, and can relax thermal stress on the transistor portion from the pillar bump 20 or a printed circuit board due to a difference in thermal expansion coefficient. Therefore, the emitter electrode 6 serves as a stress relaxation layer between the emitter layer 5 and the metal post 18 and reduces the stress applied on the emitter layer 5 and the like by 2% or more.

FIG. 5 shows the results when the thermal stress reduction rate (%) is tested in the case where the emitter electrode 6 is formed of a thick film of a refractory metal. In the simulation shown in FIG. 5, the transistor structure is the same as that of this embodiment. Regarding the size of the bump and the size of the emitter, the same typical values as those in the simulation shown in FIG. 4 are used. The temperature conditions for calculation of thermal stress are the same as those in FIG. 4. As shown in FIG. 5, in this embodiment, in the case where the stress applied on the emitter layer 5 when the thickness of the emitter electrode 6 is 0 is considered as a standard, as the thickness of the emitter electrode 6 is increased, the stress reduction (%) increases. Therefore, the same advantageous effects as those of the semiconductor device 100 of Embodiment 1 can be obtained.

In this embodiment, in the case where the emitter electrode 6 is made of W, when the thickness thereof is 100 nm or more, a stress reduction that is sufficiently larger than 2% can be obtained. Furthermore, in the case of the other refractory metal, when the thickness is 300 nm or more, a stress reduction that is sufficiently larger than 2% can be obtained. The same applies to the case where the emitter electrode 6 is made of an alloy or compound of a refractory metal.

Note that, in this embodiment, the emitter electrode 6 and the UBM layer 17 correspond to a refractory metal layer arranged between the metal post 18 and the emitter layer 5. The refractory metal layer serves as a thermal stress relaxation layer. In this case, the thickness of the refractory metal layer serving as the thermal stress relaxation layer may be calculated by adding together the thickness of the emitter electrode 6 and the thickness of the UBM layer 17. That is, in the case where the emitter electrode 6 and the UBM layer 17 are both made of W, an alloy thereof, or a compound thereof, the thickness of each layer may be set such that the sum of the thicknesses is 100 nm or more. In the case where the emitter electrode 6 and the UBM layer 17 are both made of the other refractory metal, an alloy thereof, or a compound thereof, the material and thickness of each layer may be set such that the sum of the thicknesses is 300 nm or more. The sum of the thickness of the emitter electrode 6 and the thickness of the UBM layer 17 may be obtained, for example, from the average value of thicknesses at a plurality of points of a flat portion above the emitter layer 5.

Embodiment 3

As described above, as long as a stress relaxation layer can be arranged between the metal post 18 and the emitter layer 5, the specific structure thereof is arbitrary. For example, wiring, such as the first wiring 11*a* to 11*c* or the second emitter wiring 14, may be used as a stress relaxation layer. Embodiment 3 in which part of wiring and a UBM layer are used as a stress relaxation layer will be described below.

In this embodiment, the basic structure of a semiconductor device is the same as that of the semiconductor device 100 of Embodiment 1 described with reference to FIGS. 1 to 3. However, first wiring 11*a* to 11*c* or second emitter wiring 14 is formed of a thick film of a refractory metal, an alloy of a refractory metal, or a compound of a refractory metal. Furthermore, the UBM layer 17 is formed of a thin film with a thickness of about 50 nm.

In the case where each layer of wiring is made of a refractory metal including any one of W, Ti, Mo, Ta, Nb, and Cr, an alloy of any of these refractory metals, or a compound of any of these refractory metals only, an increase in wiring resistance occurs. Therefore, as illustrated in FIGS. 6A and 6B, desirably, each layer of wiring is formed of a multilayer body including a refractory metal layer including any one of W, Ti, Mo, Ta, Nb, and Cr (including a layer of an alloy of any of these refractory metals and a layer of a compound of any of these refractory metals) and a layer of a conductor having a higher conductivity than the refractory metal (for the distinguishing purpose, referred to as a "good conductor layer"). In this case, a stress relaxation layer is formed of a multilayer body including a first layer made of a refractory metal, an alloy of a refractory metal, or a compound of a refractory metal, and a layer having a higher conductivity than the first layer. In plan view, the first layer is formed on the emitter layer 5, and the second layer is formed so as to extend in a broader region than the first layer.

FIG. 6A shows an example in which wiring has a two-layer structure and, for example, shows wiring formed of a multilayer body including a good conductor layer 111 formed of a Au film with a thickness of about 1 μm and a refractory metal layer 112. FIG. 6B shows an example in which wiring has a three-layer structure and, for example, shows wiring in which a good conductor layer 111 formed of a Au film with a thickness of about 1 μm is sandwiched between a refractory metal layer 112 with a thickness of about 350 nm and a refractory metal layer 113 with a thickness of about 50 nm.

It is arbitrary which wiring is formed of a refractory metal layer. For example, selection can be appropriately made from the following: i) the first wiring 11*a* to 11*c* only is formed of a refractory metal layer, ii) part of the first wiring 11*a* to 11*c*, for example, the first emitter wiring 11*a* only is formed of a refractory metal layer, iii) the second emitter wiring 14 only is formed of a refractory metal layer, and iv) all or part of the first wiring 11*a* to 11*c* and the second emitter wiring 14 are each formed of a refractory metal layer. In any case, the total thickness of refractory metal layers disposed between the emitter layer 5 and the pillar bump 20 may be set at 100 nm or more or 300 nm or more depending on the materials of the layers. The total thickness of the refractory metal layers may be obtained, for example, from the average value of total thicknesses of the refractory metal layers at a plurality of points of the refractory metal layers above the emitter layer 5.

Figure 7:
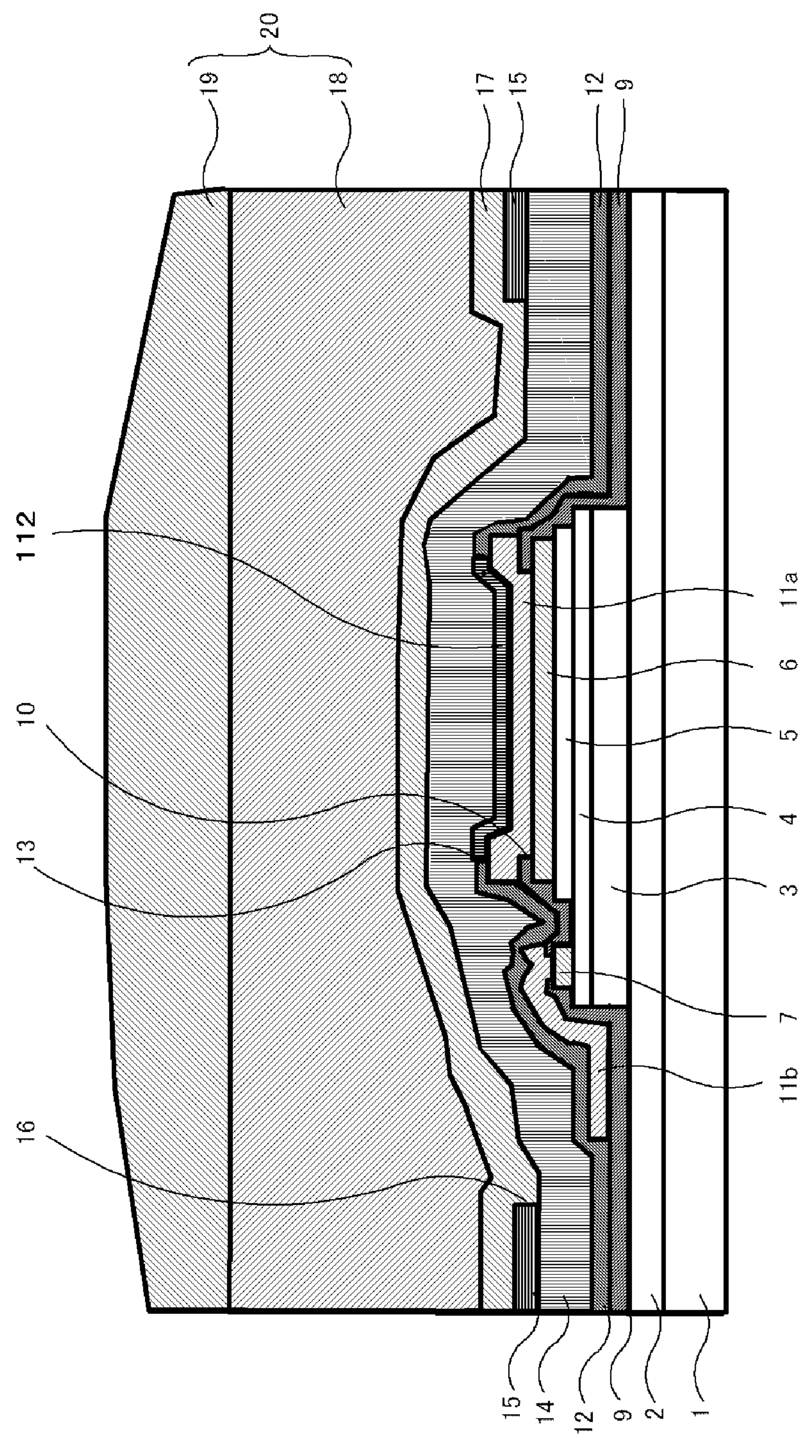
FIG. 7 is a cross-sectional view of a semiconductor device according to Embodiment 3 of the present disclosure.
Figure 8:
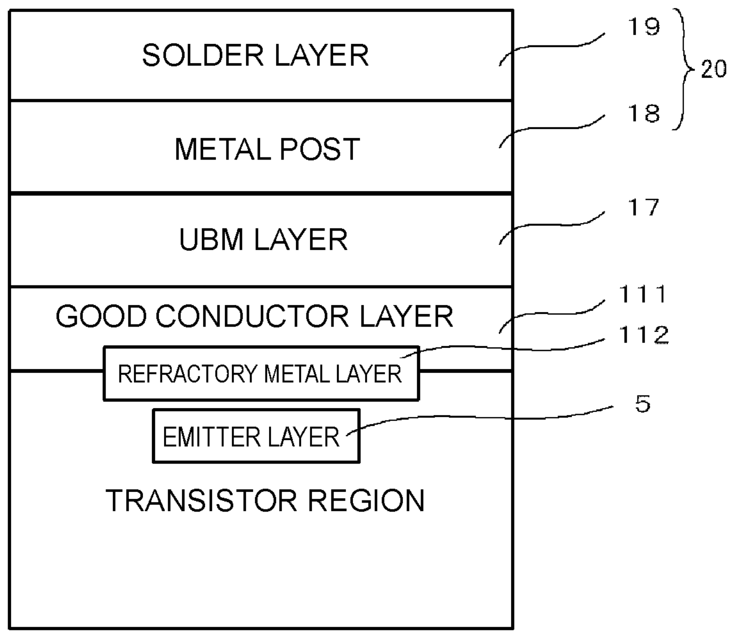
FIG. 8 is a diagram used to explain the position and structure of the wiring of a semiconductor device according to Embodiment 3.

In these cases, the wiring is not necessarily entirely formed of a refractory metal layer. That is, in order to relax thermal stress, a refractory metal may be arranged in the vicinity of the emitter layer 5, in particular, on the line connecting between the pillar bump 20, which causes thermal stress, and the emitter layer 5, i.e., in plan view, right above the emitter layer 5. Accordingly, for example, in the case where the second emitter wiring 14 is formed of a refractory metal layer, as shown in FIGS. 7 and 8, a major portion of the second emitter wiring 14 may be formed of a good conductor layer, such as a Au layer, and a refractory metal layer 112 with a thickness sufficient to obtain a stress reduction rate of 2% or more may be arranged only in a planar region covering the emitter layer 5. In other words, a stress relaxation layer may be arranged at a position above the emitter layer 5 between the first emitter wiring 11*a* and the second emitter wiring 14.

Similarly, the first emitter wiring 11*a* may be formed of a good conductor layer, such as a Au layer, and a thick refractory metal layer may be arranged on the Au layer only in a planar region covering the emitter layer 5.

Note that, since the UBM layer 17 formed of a thin film of a refractory metal assumes part of the stress reduction function, the total thickness of the refractory metal layers including the UBM layer 17 may be set at 100 nm or more or 300 nm or more depending on the materials of the layers.

Figure 9:
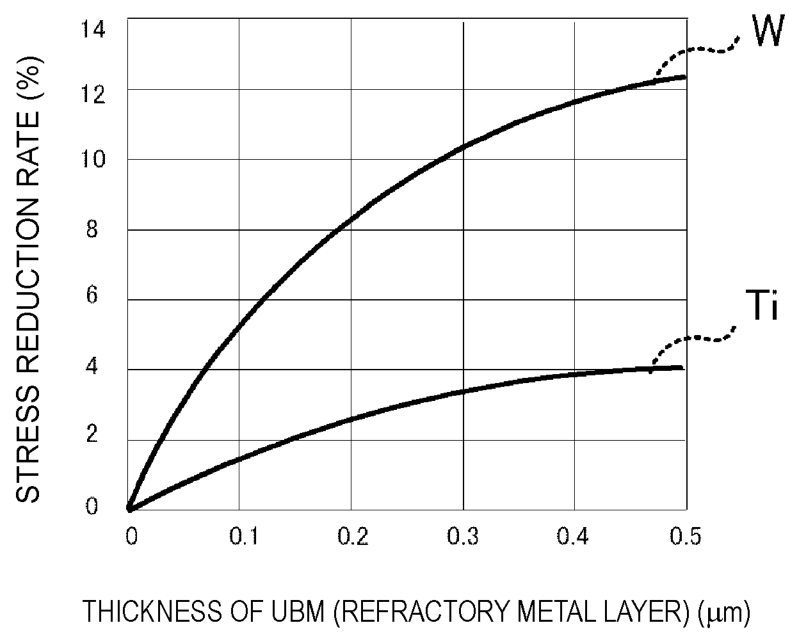
FIG. 9 is a graph showing the relationship among the material and thickness of emitter wiring and the reduction rate of thermal stress applied on an emitter layer in a semiconductor device according to Embodiment 3 of the present disclosure.

FIG. 9 shows the results when the thermal stress reduction rate is tested in the case where the first wiring 11*a* to 11*c* is formed of a Au film with a thickness of 1 μm as an upper layer and a Ti or W thick film as a lower layer. In the simulation shown in FIG. 9, the transistor structure is the same as that of this embodiment. Regarding the size of the bump and the size of the emitter, the same typical values as those in the simulation shown in FIG. 4 are used. The temperature conditions for calculation of thermal stress are the same as those in FIG. 4.

As shown in the graph, regarding W, when the thickness is 100 nm (0.1 μm) or more, the thermal stress reduction rate is 4% or more, indicating that a sufficient thermal stress reduction effect can be obtained. Furthermore, regarding Ti which has a relatively high thermal expansion coefficient among refractory metals, it has been confirmed that, when the thickness is 300 nm (0.3 μm), a stress reduction rate of 2% or more can be obtained.

Note that in the case where the second emitter wiring 14 is made of a refractory metal, as shown in FIG. 7, desirably, a particularly thick refractory metal layer 112 is arranged in a region covering the emitter layer 5. As shown in the drawing, by arranging the thick refractory metal layer 112, the thermal stress applied on the emitter layer 5 can be easily reduced by 2% or more.

Furthermore, since a refractory metal, such as Ti, has a lower thermal conductivity than Au or the like, when the second emitter wiring 14 is entirely formed of a thick film of a refractory metal or the like, heat dissipation from the HBT decreases compared with the case where the second emitter wiring 14 is formed of Au or the like. As shown in FIGS. 6 to 8, by employing a structure in which the refractory metal layer 112 is formed, in a lower layer portion (or upper layer portion) of the good conductor 111, only on the upper side of the emitter layer 5, the heat dissipation property can be improved, and the thermal stress reduction effect can be ensured.

Note that the good conductor layer may be made of a material having a linear thermal expansion coefficient of Cu of $16.4\times10^{-6}$/K, and at least part of the good conductor layer may be used as part of a stress relaxation layer for reducing thermal stress.

Embodiment 4

The embodiments of the present disclosure have been described above. However, the structure of the HBT according to the present disclosure is not limited to the structure shown in FIGS. 1 to 3, and any structure can be employed as long as the HBT can function as a transistor.

For example, in the embodiments described above, a structure in which the emitter electrode 6 is formed on the emitter layer 5, and the first emitter wiring 11*a* is arranged on the emitter electrode 6 is exemplified. However, for example, it is also possible to employ a structure in which the emitter electrode 6 is removed, and the first emitter wiring 11*a* is in direct contact (electrical contact) with the emitter layer 5. That is, the first emitter wiring 11*a* may also serve as an emitter electrode. In other words, the emitter wiring and the emitter electrode may be integrally formed, and the emitter wiring may also serve as the emitter electrode.

Figure 10:
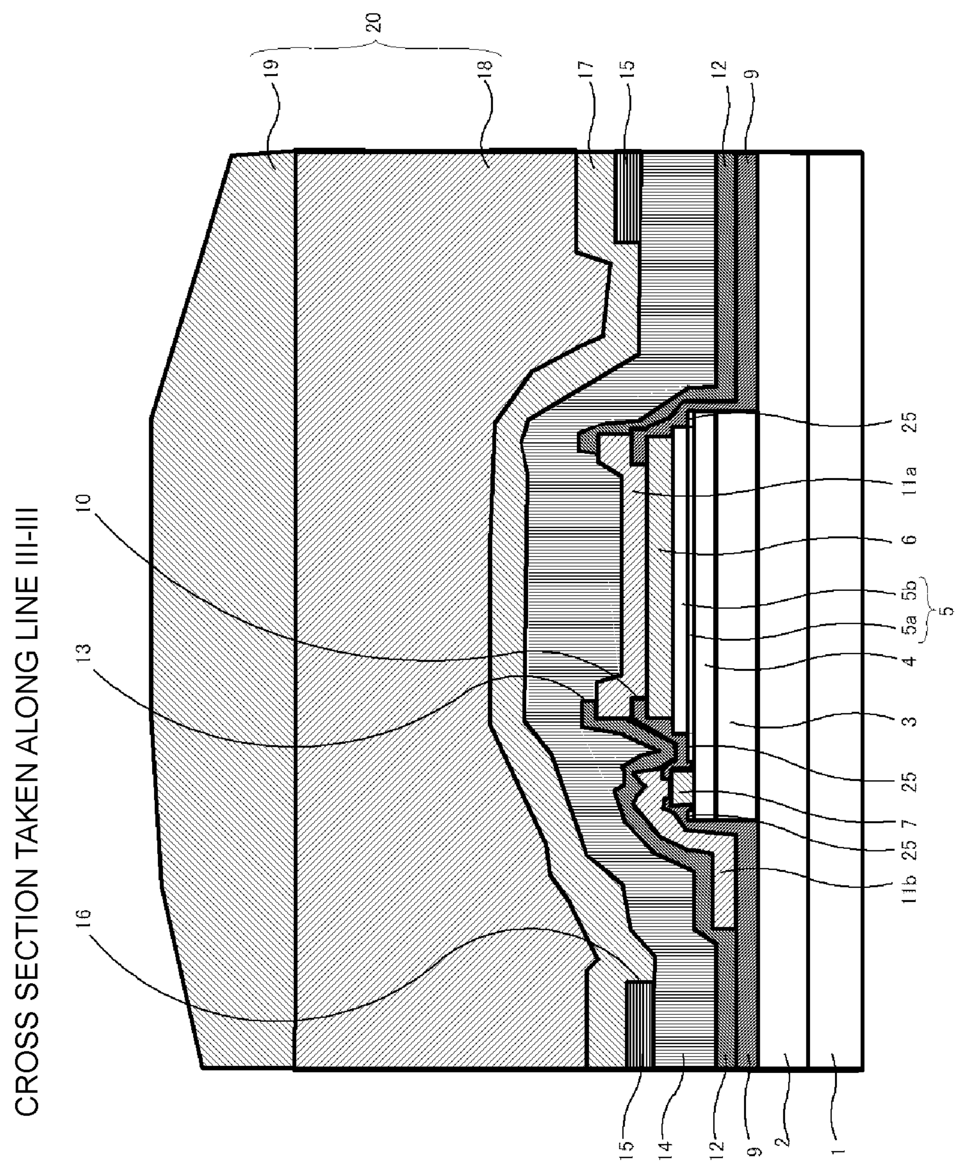
FIG. 10 is a cross-sectional view of a semiconductor device according to Embodiment 4 of the present disclosure.

In this case, as shown in FIG. 10, desirably, the emitter layer 5 includes an intrinsic emitter layer 5*a* which is an n-type InGaP layer (e.g., 30 to 40 nm) on the base layer 4 side and an emitter mesa layer 5*b* disposed thereon. The emitter mesa layer 5*b* includes a heavily doped n-type GaAs layer (e.g., 100 nm) and a heavily doped n-type InGaAs layer (e.g., 100 nm). The InGaAP layer constitutes a region disposed on the intrinsic emitter layer 5*a* and a base layer 4 extending therefrom, i.e., a so-called ledge layer 25. A base electrode 7 is brought into contact with the base layer 4 through an opening of the ledge layer 25.

Although the intrinsic emitter layer 5*a* and the ledge layer 25 are made of the same InGaP, only an InGaP portion on which the semiconductor of the emitter mesa layer 5*b* is disposed functions as an emitter of the transistor. On the other hand, the ledge layer 25 does not function as an emitter because a semiconductor layer is not disposed thereon, and functions as a protective layer that inhibits surface recombination in the base layer 4. In this application, the intrinsic emitter layer 5*a* and the emitter mesa layer 5*b* that contribute to the operation of the HBT are referred to as the emitter layer, and the ledge layer 25 is not included in the emitter layer.

In the case where the HBT has such a structure, as in Embodiment 1, when a UBM layer 17 is made of a refractory metal (Ti, Mo, Ta, Nb, or Cr), an alloy thereof, or a compound thereof, with a thickness of 300 nm or more, a stress reduction rate of 2% or more can be achieved. Furthermore, when the UBM layer 17 is made of W, an alloy thereof, or a compound thereof, with a thickness of 100 nm, a stress reduction rate of 2% or more can be achieved. Furthermore, as in Embodiment 3, when a lower layer under a Au layer in first emitter wiring 11*a* (also serving as an emitter electrode) is made of a refractory metal (Ti, Mo, Ta, Nb, or Cr), an alloy thereof, or a compound thereof with a thickness of 300 nm or more, a stress reduction rate of 2% or more can be achieved. In particular, when the lower layer is made of W, an alloy thereof, or a compound thereof, with a thickness of 100 nm, a stress reduction rate of 2% or more can be achieved. For this reason, as in Embodiments 1 to 3, the thermal stress applied on the HBT can be relaxed. Accordingly, it is possible to prevent a problem in that, when an operating life test is performed under an applied current in a high-temperature environment, the current amplification factor of the HBT decreases in a short period of time, and reliability of the semiconductor device 100 can be improved.

Furthermore, by arranging the emitter layer 5 right below a pillar bump 20 so that high heat dissipation efficiency can be ensured, an increase in temperature of the HBT can be suppressed, the performance of the HBT can be brought out, and high-frequency characteristics can be improved.

Furthermore, the arrangement position of the pillar bump 20 with respect to the emitter layer 5 is not limited, and the degree of freedom of layout is high. The semiconductor device can be arranged with a small overall size, and reduction in size and cost of the semiconductor device can be achieved.

Furthermore, since the first emitter wiring 11*a* is also used as the emitter electrode, manufacturing is facilitated, and the manufacturing cost can be reduced.

Furthermore, since the ledge layer 25 made of InGaP covers the base layer 4, it is possible to inhibit surface recombination in the base layer 4 or the like, and reliability of the HBT transistor can be improved.

Note that the base electrode 7 may be integrated with the base wiring 11*b*, and the collector electrode 8 may be integrated with the collector wiring 11*c* so that the base wiring 11*b* is brought into direct contact with the base layer 4, and the collector wiring 11*c* is brought into direct contact with the subcollector layer 2.

In each of Embodiments 1 to 4, the semiconductor device including one bipolar transistor has been described as an example. However, a semiconductor in which a plurality of bipolar transistors are formed on a semi-insulating GaAs substrate may be used. Furthermore, although, as a bump, the pillar bump has been described as an example, besides the pillar bump, for example, a solder bump or a stud bump may be used.

Furthermore, the materials and size, such as thickness, shown in each of the embodiments are exemplification and not limited thereto. For example, although the case where the emitter layer 5 is formed of an InGaP layer and the base layer 4 is formed of a GaAs layer has been described as an example, the combination of the materials of the emitter layer and the base layer (emitter layer/base layer) is not limited to InGaP layer/GaAs layer. For example, AlGaAs layer/GaAs layer, InP layer/InGaAs layer, InGaP layer/GaAsSb layer, InGaP layer/InGaAsN layer, Si layer/SiGe layer, AlGaN layer/GaN layer, or the like may be used.

Furthermore, in each of the embodiments, the case where the planar shape of the emitter layer 5 is rectangular has been described as an example. However, the planar shape of the emitter layer may be circular, elliptic, hexagonal, octagonal, or the like.

Figure 11:
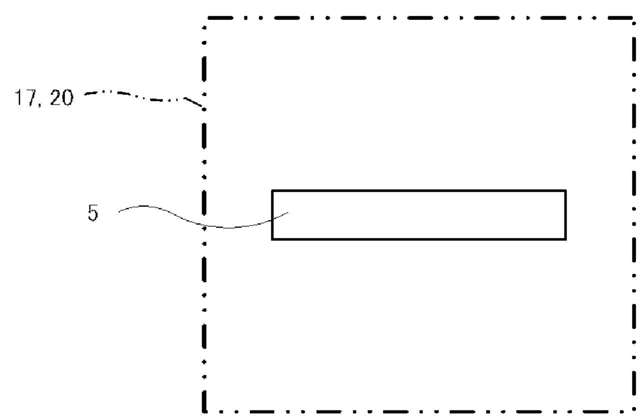
FIG. 11 is a diagram showing the planar positional relationship among a UBM layer, a bump, and an emitter layer in a semiconductor device according to an embodiment of the present disclosure.

FIG. 11 is a plan view schematically showing the positional relationship among the emitter layer 5 and the outer edges of the UBM layer 17 and the pillar bump 20 shown in FIG. 1. As shown in FIGS. 1 and 11, in the embodiments, in plan view, the UBM layer 17 and the pillar bump 20 are arranged and formed so as to cover the entire surface of the emitter layer 5. However, the present disclosure is not limited thereto. As long as thermal resistance and electrical resistance between the HBT and the pillar bump 20 can be decreased and the thermal stress applied on the emitter layer 5 can be relaxed, the pillar bump 20 may be formed at a position shifted from the position right above the emitter layer 5.

Figure 12:
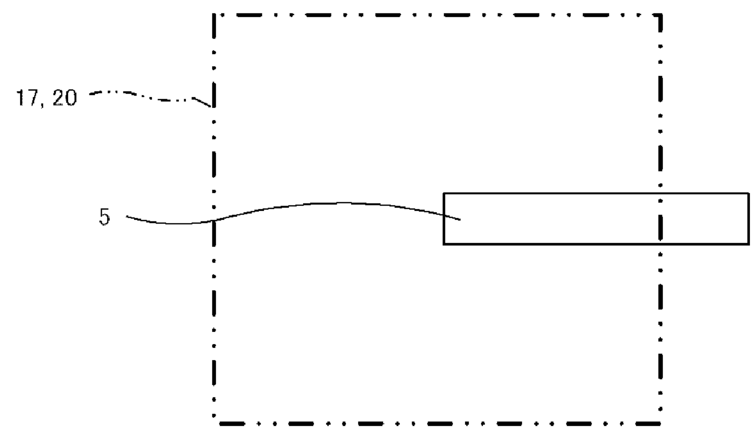
FIG. 12 is a diagram showing a modification example of the relationship among a UBM layer, a bump, and an emitter layer in a semiconductor device according to an embodiment of the present disclosure.

For example, as schematically shown in a plan view of FIG. 12, the emitter layer 5 may be formed so as to partially protrude from the region where the UBM layer 17 and the pillar bump 20 are formed. In this case, desirably, the area of a region of the emitter layer 5 overlapping the UBM layer 17 and the pillar bump 20 is larger than the area of a non-overlapping region. Specifically, desirably, the area of a region of the emitter layer 5 overlapping the UBM layer 17 and the pillar bump 20 is 51% or more, preferably 60% or more, of the area of the entire emitter layer 5. The reason for this is that, when the degree of overlapping is in such a range, heat generated in the HBT can be efficiently transferred and dissipated to the pillar bump 20, electrical resistance between the emitter layer 5 and the pillar bump 20 can be suppressed, and stress between the emitter layer 5 and the pillar bump 20 can be relaxed, resulting in improvement in reliability of the device.

Figure 13:
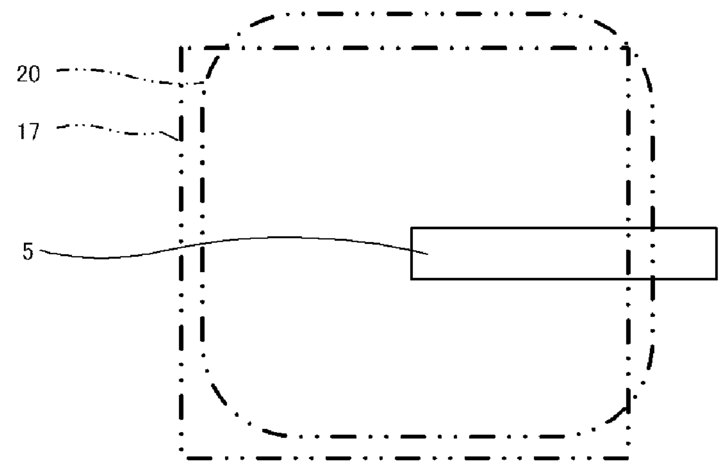
FIG. 13 is a diagram showing an example in which a UBM layer and a bump differ in position and shape in a semiconductor device according to an embodiment of the present disclosure.

Furthermore, in the embodiments, the example in which the edge of the UBM layer 17 overlaps the edge of the pillar bump 20 in plan view has been shown. It is not necessary that the edge of the UBM layer 17 fully overlap the edge of the pillar bump 20. That is, as shown in FIG. 13, the outer edge of the UBM layer 17 may be larger or smaller than the outer edge of the pillar bump 20 in plan view, and either is included in the technical scope of the present disclosure. Furthermore, the UBM layer 17 and the pillar bump 20 may have different planar shapes. In the case where the edge of the UBM layer 17 is shifted from the edge of the pillar bump 20 as shown in FIG. 13, desirably, the area of a region of the emitter layer 5 overlapping both the UBM layer 17 and the pillar bump 20 is 51% or more, preferably 60% or more, of the area of the entire emitter layer 5.

Figure 14:
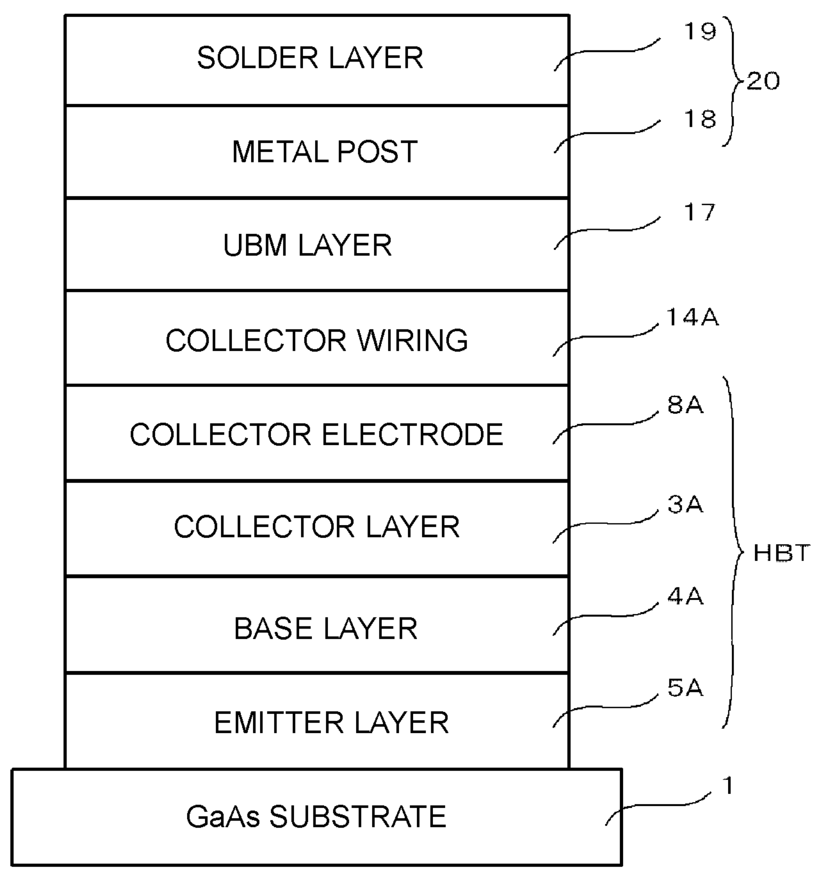
FIG. 14 is a schematic cross-sectional view showing an element structure of a semiconductor device according to a modification example of the present disclosure.

In the embodiments, the HBT having a structure in which the semiconductor layers, i.e., the collector layer 3, the base layer 4, and the emitter layer 5 in this order, are stacked on the GaAs substrate 1 has been mainly described. The present disclosure is not limited thereto. For example, as shown in a schematic cross-sectional view of FIG. 14, the present disclosure can also be applied to an HBT having a structure in which semiconductor layers, i.e., an emitter layer 5A, a base layer 4A, and a collector layer 3A in this order, are stacked on a GaAs substrate 1.

In this case, for example, a collector electrode 8A and collector wiring 14A are formed in this order on the collector layer 3A, a UBM layer 17 is formed on the collector wiring 14A, and a pillar bump 20 is formed on the UBM layer 17. According to this structure, since the pillar bump 20 is formed directly above the collector layer 3A, electrical resistance and thermal resistance between the collector layer 3A and the pillar bump 20 can be reduced, and also, thermal stress applied on the semiconductor layers, i.e., the collector layer 3A, the base layer 4A, and the emitter layer 5A, can be relaxed by the UBM layer 17 which serves as at least part of a stress relaxation layer.

Furthermore, from the same viewpoint as that of Embodiment 2, the UBM layer 17 may be formed of a thin film of about 50 nm, and the collector electrode 8A may be made of a refractory metal, an alloy of a refractory metal, or a compound of a refractory metal with a thickness of 300 nm or more. In this case, the collector electrode 8A serves as part of the HBT, and at least part of the collector electrode 8A and the UBM layer 17 also serve as a stress relaxation layer.

Furthermore, from the same viewpoint as that of Embodiment 3, layers of wiring, including the collector wiring 14A, located above the collector layer 3A may be made of a refractory metal, an alloy of a refractory metal, or a compound of a refractory metal with a thickness of 300 nm or more. In this case, at least part of the layers of wiring and the UBM layer 17 also serve as a stress relaxation layer.

Furthermore, in order to avoid an increase in wiring resistance, as illustrated in FIGS. 6A and 6B, each layer of wiring may be formed of a multilayer body including a refractory metal layer (including a layer of an alloy of a refractory metal and a layer of a compound of a refractory metal) and a good conductor layer.

Furthermore, only a portion of wiring located above the HBT, more precisely, above the collector layer 3A may be made of a refractory metal or the like. Similarly, a portion of wiring located above the HBT, more precisely, above the collector layer 3A may be formed of a thick refractory metal layer. For example, a stress relaxation layer may be arranged only at a portion between the collector layer 3A and the collector wiring 14A. Alternatively, the collector wiring may be formed of first collector wiring which connects the collector electrode to an external circuit and second collector wiring connected to the first collector wiring, and a stress relaxation layer may be located between the first collector wiring and the second collector wiring at a position on the collector layer in plan view.

Furthermore, from the same viewpoint as that of Embodiment 4, the collector electrode 8A and the collector wiring 14A may be integrally formed using a refractory metal or the like, and the collector wiring 14A may also serve as the collector electrode 8A.

Furthermore, regarding the position of the collector layer 3A in plan view, the collector layer 3A may be located only within the outer edges of the UBM layer 17 and the pillar bump 20, or may be arranged so as to partially protrude from the outer edges. In the case where the collector layer 3A is formed so as to partially protrude from the outer edges of the UBM layer 17 and the pillar bump 20, desirably, the area of a region of the collector layer 3A overlapping the UBM layer 17 and the pillar bump 20 is 51% or more, preferably 60% or more, of the area of the entire collector layer 3A.

The embodiments and modification examples of the present disclosure (including those described in explanatory notes; hereinafter the same) have been described above, but the present disclosure is not limited thereto. The present disclosure also includes appropriate combinations of the embodiments and modification examples and those obtained by adding appropriate changes thereto. For example, Embodiments 3 and 4 may be combined with each other, the emitter electrode and the emitter wiring may be integrated with each other and formed into a multilayer structure, and the refractory metal layer may be thickened only at the portion above the emitter region.

What is claimed is:

1. A semiconductor device comprising:

a heterojunction bipolar transistor including an emitter layer and a collector layer;

a bump formed above the heterojunction bipolar transistor; and a stress relaxation layer which is arranged between the emitter layer or the collector layer of the heterojunction bipolar transistor and the bump, is made of a refractory metal including W, an alloy of a refractory metal including W, or a compound of a refractory metal including W, and has a thickness of 100 nm or more, wherein the heterojunction bipolar transistor further includes a base layer and an emitter electrode connected to the emitter layer, wherein the semiconductor device further comprises:

emitter wiring which is electrically connected to the emitter electrode and formed at a position covering the heterojunction bipolar transistor; and an insulating layer which is formed on the emitter wiring and has an opening that exposes a region right above the emitter layer, wherein the stress relaxation layer includes a layer formed on the insulating layer and connected to the emitter wiring through the opening, wherein the bump includes a metal layer which is formed on the stress relaxation layer and has a higher thermal expansion coefficient than the stress relaxation layer, and a solder layer formed on the metal layer, wherein the bump, the stress relaxation layer, and the emitter layer are formed at overlapping positions in plan view, and wherein the area of a portion of the emitter layer overlapping the bump and the stress relaxation layer is 51% or more of the area of the emitter layer.

2. The semiconductor device according to claim 1, wherein the stress relaxation layer includes at least part of the emitter electrode.

3. The semiconductor device according to claim 1, wherein the emitter wiring is formed on the emitter electrode and connects the emitter electrode to an external circuit, and the stress relaxation layer includes at least part of the emitter wiring.

4. The semiconductor device according to claim 3, wherein the emitter wiring further includes first emitter wiring which connects the emitter electrode to an external circuit and second emitter wiring connected to the first emitter wiring, and the stress relaxation layer is located between the first emitter wiring and the second emitter wiring at a position on the emitter layer in plan view.

5. The semiconductor device according to claim 3, wherein the emitter wiring and the emitter electrode are integrally formed, and the emitter wiring also serves as the emitter electrode.

6. The semiconductor device according to claim 1, wherein the heterojunction bipolar transistor further includes a collector electrode connected to the collector layer, wherein the semiconductor device further comprises:

collector wiring which is electrically connected to the collector electrode and formed at a position covering the heterojunction bipolar transistor; and an insulating layer which is formed on the collector wiring and has an opening that exposes a region right above the collector layer;

wherein the stress relaxation layer includes a layer formed on the insulating layer and connected to the collector wiring through the opening, and wherein the bump includes a metal layer which is formed on the stress relaxation layer and has a higher thermal expansion coefficient than the stress relaxation layer, and a solder layer formed on the metal layer.

7. The semiconductor device according to claim 6, wherein the bump, the stress relaxation layer, and the collector layer are formed at overlapping positions in plan view, and the area of a portion of the collector layer overlapping the bump and the stress relaxation layer is 51% or more of the area of the collector layer.

8. The semiconductor device according to claim 1, wherein the heterojunction bipolar transistor further includes collector electrode connected to the collector layer, and the stress relaxation layer includes at least part of the collector electrode.

9. The semiconductor device according to claim 1, wherein the heterojunction bipolar transistor further includes a collector electrode connected to the collector layer, and collector wiring which is formed on the collector electrode and connects the collector electrode to an external circuit, and the stress relaxation layer includes at least part of the collector wiring.

10. The semiconductor device according to claim 9, wherein the collector wiring further includes first collector wiring which connects the collector electrode to an external circuit and second collector wiring connected to the first collector wiring, and the stress relaxation layer is located between the first collector wiring and the second collector wiring at a position on the collector layer in plan view.

11. The semiconductor device according to claim 9, wherein the collector wiring and the collector electrode are integrally formed, and the collector wiring also serves as the collector electrode.

12. The semiconductor device according to claim 1, wherein the stress relaxation layer includes a plurality of layers which are stacked together, and the total thickness of the layers made of a refractory metal, an alloy of a refractory metal, or a compound of a refractory metal is 100 nm or more.

13. The semiconductor device according to claim 1, wherein the stress relaxation layer is formed of a multilayer body including a first layer made of a refractory metal, an alloy of a refractory metal, or a compound of a refractory metal, and a second layer having a higher conductivity than the first layer.

14. A semiconductor device comprising:

a heterojunction bipolar transistor including an emitter layer and a collector layer;

a bump formed above the heterojunction bipolar transistor; and a stress relaxation layer which is arranged between the emitter layer or the collector layer of the heterojunction bipolar transistor and the bump, is made of a refractory metal including any one of Ti, Mo, Ta, Nb, and Cr, an alloy of any of these refractory metals, or a compound of any of these refractory metals, and has a thickness of 300 nm or more, wherein the heterojunction bipolar transistor further includes a base layer and an emitter electrode connected to the emitter layer, wherein the semiconductor device further comprises:

emitter wiring which is electrically connected to the emitter electrode and formed at a position covering the heterojunction bipolar transistor; and an insulating layer which is formed on the emitter wiring and has an opening that exposes a region right above the emitter layer, wherein the stress relaxation layer includes a layer formed on the insulating layer and connected to the emitter wiring through the opening, wherein the bump includes a metal layer which is formed on the stress relaxation layer and has a higher thermal expansion coefficient than the stress relaxation layer, and a solder layer formed on the metal layer, wherein the bump, the stress relaxation layer, and the emitter layer are formed at overlapping positions in plan view, and wherein the area of a portion of the emitter layer overlapping the bump and the stress relaxation layer is 51% or more of the area of the emitter layer.

15. The semiconductor device according to claim 14, wherein the stress relaxation layer includes a plurality of layers which are stacked together, and the total thickness of the layers made of a refractory metal, an alloy of a refractory metal, or a compound of a refractory metal is 300 nm or more.

16. The semiconductor device according to claim 14, wherein the stress relaxation layer includes at least part of the emitter electrode.

17. The semiconductor device according to claim 14, wherein the emitter wiring is formed on the emitter electrode and connects the emitter electrode to an external circuit, and the stress relaxation layer includes at least part of the emitter wiring.

* * * * *